United States Patent
Schneider et al.

(10) Patent No.: US 7,795,935 B2
(45) Date of Patent: Sep. 14, 2010

(54) BIAS SIGNAL DELIVERY

(75) Inventors: Jacob S. Schneider, Austin, TX (US);
Harishankar Sridharan, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 128 days.

(21) Appl. No.: 11/864,921

(22) Filed: Sep. 29, 2007

(65) Prior Publication Data

US 2009/0085623 A1   Apr. 2, 2009

(51) Int. Cl.
*H03L 7/06* (2006.01)
(52) U.S. Cl. .................... 327/158; 327/149
(58) Field of Classification Search .......... 327/149, 327/150, 153, 158, 159, 161, 261
See application file for complete search history.

(56) References Cited

U.S. PATENT DOCUMENTS

| | | | | |
|---|---|---|---|---|
| 5,687,201 A | * | 11/1997 | McClellan et al. | 375/374 |
| 6,686,785 B2 | * | 2/2004 | Liu et al. | 327/158 |
| 6,831,492 B1 | * | 12/2004 | Abbasi et al. | 327/158 |
| 7,139,348 B1 | * | 11/2006 | Fu et al. | 375/376 |
| 7,161,402 B1 | * | 1/2007 | Sompur et al. | 327/158 |
| 7,602,859 B2 | | 10/2009 | Cheng | |

* cited by examiner

*Primary Examiner*—Hai L Nguyen
(74) *Attorney, Agent, or Firm*—Erik R. Nordstrom

(57) ABSTRACT

Provided herein are approaches for controlling remote slave DLL circuits with a master DLL circuit by conveying a relevant bias signal as a current signal instead of as a voltage signal.

2 Claims, 2 Drawing Sheets

BIAS SIGNAL DELIVERY

BACKGROUND

FIG. 1 shows a conventional master-slave type delay locked loop (DLL) circuit. The circuit generally includes a master DLL circuit 102 coupled to a slave DLL circuit 108 through a replica bias generator circuit 104 to control the delay of a signal (IN), e.g., clock, pulse, or the like, applied to the slave circuit 108 and provide the signal (OUT) from the slave DLL delayed by a desired amount, as dictated by the master DLL circuit 102. Master and slave DLLs can be configured in a variety of different ways. For example, a master DLL (such as master DLL 102) may comprise a phase-frequency detector, a charge pump, a loop filter, and a programmable voltage controlled delay line (VCDL), coupled as is commonly known, to generate a clock with desired delay characteristics from an applied reference clock (RefClk) and a self-generated feedback clock (Feedback Clk). Likewise, a suitable slave DLL to work in cooperation with the master DLL may include its own VCDL, along with a phase interpolator for added granularity.

The replica bias generator circuit 104 generates a replica of a bias signal (internal to the master DLL) used to control the master DLL circuit's VCDL. This replica bias signal (Slave Bias) is provided to the slave VCDL to control the delay of the signal applied to the slave DLL 108 in accordance with the desired delay that is generated at the master DLL circuit 102. (Note that the bias generator or replica bias generator may actually be part of the master DLL, providing the bias signal to both the master and slave DLLs, or alternatively, as is shown in FIG. 1, it may be a separate circuit to replicate, or create a suitable derivation of, a bias signal generated from the master DLL circuit.

The slave DLL circuit will generally be located close to the master circuit. This allows the slave to replicate or program its delay cells in the delay line to mimic the master delay characteristics. The close proximity makes it easier to protect the voltage bias signals through shielding and prevents aggressors (such as clocks) from routing over them.

Master-slave DLLs are used in a variety of applications such as with a double data rate (DDR) memory interface where they are used to delay various control signals. For example, with contemporary DDR systems, they are used to delay strobes to be 90 degrees out of phase from data bits in order to optimize margins in the READ and WRITE paths. DDR channels typically include 64 data bits organized into eight separate 8-bit modules, with each module having its own strobe signal. Thus, eight separate master/slave DLL circuits are typically employed to provide these eight separate strobe signals. Ideally, they are controlled to be at the same delay relative to a common reference clock. Thus, even though a single master circuit can source several different slave DLLs if they are sufficiently close to the master DLL circuit, eight separate master-slave sets are typically used since slaves would usually be too far from a common master circuit. Unfortunately, this results in excess power consumption since each master may consume on the order of tens of mill-Watts of power. Accordingly, a new approach is desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
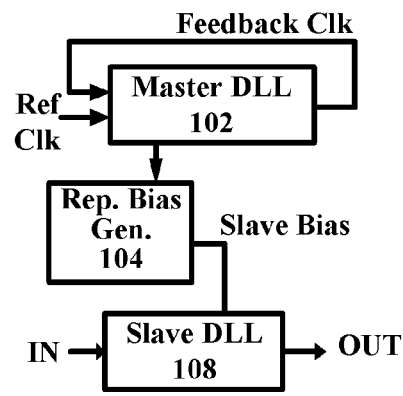
FIG. 1 is a diagram of a conventional master-slave DLL circuit.
Figure 2:
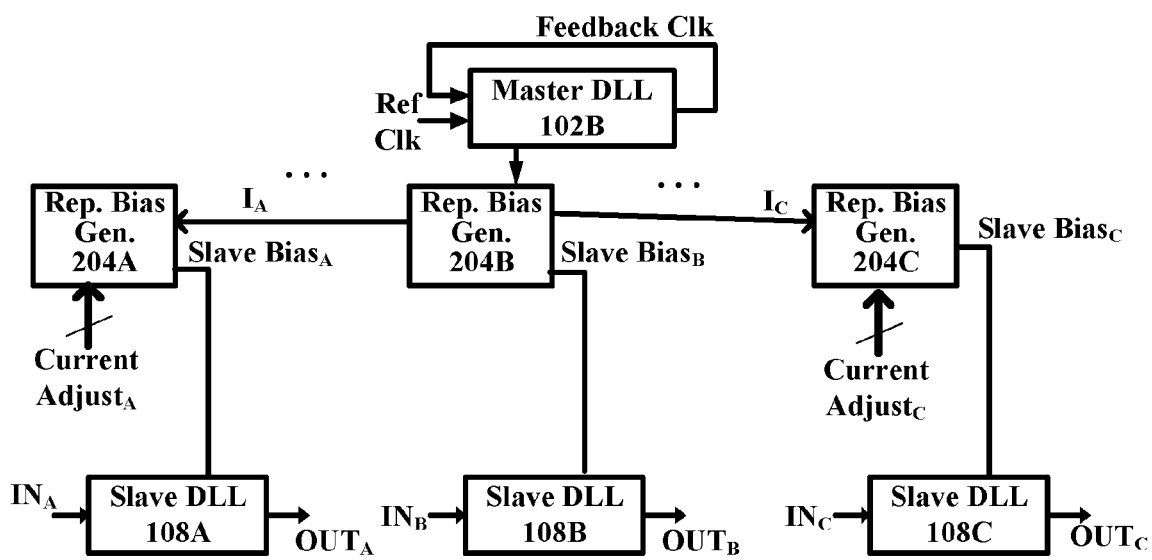
FIG. 2 is a diagram of a master DLL with multiple slave DLLs distributed over relatively remote distances in accordance with some embodiments.

FIG. 2 shows a master DLL circuit 102B providing bias control for three separate slave DLL circuits 108A, 108B, and 108C via associated replica bias generator circuits 204A, 204B, and 204C, respectively. Slave circuit 108B, along with replica bias generator circuit 204B, are relatively close to the master 102B. However, slave circuits 108A and 108C (remote slave circuits), along with their associated bias generator circuits (remote bias generator circuits), may be assumed to be relatively distant from the master DLL 102B. (They are distant enough that if the slave bias signals are conveyed using voltage signals, they may be corrupted or otherwise degraded.)

In order to overcome inaccuracies that might otherwise result if the slave bias copies from bias generator 204B (or master 102B, itself) were provided as voltage signals, they are converted to current signals in the replica bias generator circuit 204B (the master replica bias generator). From here, they are conveyed to the remote bias generator circuits (204A, 204C) and from there, converted back to voltage signals (Slave Bias$_A$, Slave Bias$_C$) and provided to their respective slave circuits.

Each remote bias generator has a current-to-voltage converter to generate the slave bias voltage signal from the bias current signal provided by the master generator. The converters also have adjustment circuitry to adjust the generated bias voltage (or received current) based on a pre-programmed current adjust signal (Current Adjust$_A$, Current Adjust$_C$). (That is, depending on the particular implementation, the current bias signal may be adjusted before being converted to the slave voltage bias signal, or alternatively, the slave voltage bias signal may be adjusted directly after the current-to-voltage conversion.) The signal adjustment allows for extra current to be added (or removed) to adjust the bias value depending on the trace resistance for a given bias current pathway to compensate for line losses. Thus, as long as the resistance of the traces are known, the current signals ($I_A$, $I_C$) may be accurately conveyed to the remote bias generators.

It should be appreciated that the master bias generator circuit may be implemented with any suitable circuitry. For example, the master bias generator 204B could comprise a number (two in the depicted embodiment) of voltage controlled current sources. They could be wholly analog or part analog and part digital, e.g., an analog to digital converter could be used to convert the bias signal generated from the master DLL 102B. The generated digital bias signal could then be used to control adjustable current sources, e.g., binary or temperature weighted current source legs, to create the current signals ($I_A$, $I_C$). On the other hand, simpler implementations, e.g., well-known analog circuits to convert from voltage to current, could be used. Similarly, any suitable circuit may be used to implement the remote bias generator circuits. For example, any suitable current-to-voltage circuit, e.g., with controllably engageable current legs to be controlled by the current adjust signal, could be used.

Ideally, there will be a single programmable setting for each current adjust signal at each remote bias generator that will allow their generated slave voltage bias signals to sufficiently closely mimic that of the master DLL. Unfortunately, however, with some implementations, this approach may increase inaccuracies due to deviations (within the same chip or from chip to chip) in process, voltage, and temperature (PVT). For example, while one programmable code may yield a good match for master and remote bias generators in a chip with fast transistors, the same code may not acceptably perform with slower chips. Accordingly, another embodiment disclosed in FIG. 3 is provided to take account of these variations.

Figure 3:
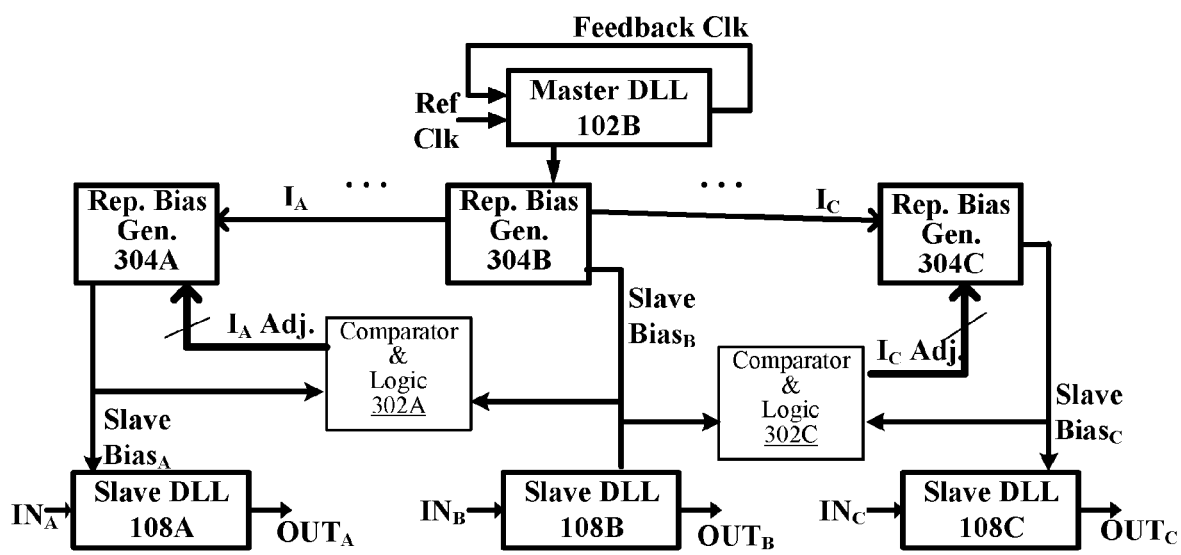
FIG. 3 is a diagram of a master DLL with multiple slave DLLs distributed over relatively remote distances in accordance with some additional embodiments.

FIG. 3 shows a master-slave DLL configuration as in FIG. 2 but with circuitry to calibrate (e.g., periodically) current adjustment in the remote bias generators. In this way, variation, regardless of what is causing it, may be significantly reduced. In the depicted embodiment, for each remote generator, there is a comparator and logic circuit (302A, 302C for remote bias generators 204A, 204C, respectively), coupled as shown to provide the current adjustment ($I_A$ Adj., $I_C$ Adj.) signals. For a given remote bias generator, the inputs to the associated comparator are the Slave Bias signal (master voltage bias signal) from the master bias generator 204B and the Slave Bias signal from the remote bias generator that is used to control the associated slave DLL.

Ideally, to more simply match IR drop to the comparator for each of these two input signals, the trace route of the voltage bias signal from the master generator and that of the remote slave bias signal from the remote bias generator are matched. For example, the comparator and logic circuitry may be disposed halfway between the master and remote bias generator blocks. In this way, noise components may be better offset by one another to provide a more accurate result.

In operation, the comparator determines any difference between the two biases, and the logic adjusts the current strength accordingly to minimize this difference. Since this compensation consumes power as it's operating, it need not be activated continuously. For example, it could be activated initially at startup and possibly at later times, depending on the stability of the operating environment.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A DLL circuit, comprising:
 a master bias generator to generate a current bias signal;
 a remote bias generator coupled to the master generator to receive the current bias signal and convert it into a voltage bias signal, said remote bias generator having an adjustment to adjust the generated voltage bias signal, wherein the adjustment comprises a variable current source to generate current to be combined with the current bias signal to adjust for IR drop losses; and a slave DLL circuit coupled to the remote bias generator to receive the adjusted voltage bias signal and to delay an incoming signal based on said adjusted voltage bias signal.

2. A method comprising:

controlling a remote slave DLL circuit from a master DLL circuit, including:

generating a master voltage bias signal for the master DLL circuit;

converting the master voltage bias signal to a current bias signal;

providing the current bias signal to a bias generator circuit for the remote slave DLL circuit;

adjusting the current bias signal to compensate for IR losses to the remote bias generator;

converting the current bias signal to a slave voltage bias signal; and controlling the slave DLL circuit with the slave voltage bias signal.

\* \* \* \* \*